(12) United States Patent
Bessho et al.

(10) Patent No.: US 8,565,013 B2
(45) Date of Patent: Oct. 22, 2013

(54) STORAGE ELEMENT AND STORAGE DEVICE

(75) Inventors: Kazuhiro Bessho, Kanagawa (JP); Masanori Hosomi, Tokyo (JP); Hiroyuki Ohmori, Kanagawa (JP); Yutaka Higo, Kanagawa (JP); Kazutaka Yamane, Kanagawa (JP); Tetsuya Asayama, Tokyo (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 26 days.

(21) Appl. No.: 13/434,478

(22) Filed: Mar. 29, 2012

(65) Prior Publication Data

US 2012/0281462 A1 Nov. 8, 2012

(30) Foreign Application Priority Data

May 6, 2011 (JP) ................. 2011-103683

(51) Int. Cl.
*G11C 11/00* (2006.01)
(52) U.S. Cl.
USPC ............................ 365/158; 365/171; 365/173
(58) Field of Classification Search
USPC ......................................... 365/158, 171, 173
See application file for complete search history.

(56) References Cited

U.S. PATENT DOCUMENTS

| | | | |
|---|---|---|---|
| 7,573,736 B2 * | 8/2009 | Wang et al. | 365/158 |
| 8,208,295 B2 * | 6/2012 | Dieny | 365/171 |
| 2009/0213638 A1 * | 8/2009 | Morise et al. | 365/145 |
| 2009/0218645 A1 * | 9/2009 | Ranjan et al. | 257/421 |
| 2012/0063221 A1 * | 3/2012 | Yamane et al. | 365/173 |
| 2012/0106239 A1 * | 5/2012 | Xi et al. | 365/158 |
| 2012/0175717 A1 * | 7/2012 | Bessho et al. | 257/421 |
| 2012/0287696 A1 * | 11/2012 | Ohmori et al. | 365/66 |

FOREIGN PATENT DOCUMENTS

| | | |
|---|---|---|
| JP | 2003-017782 | 1/2003 |
| JP | 2008-227388 | 9/2008 |

OTHER PUBLICATIONS

L. Berger, "Emission of spin waves by a magnetic multilayer traversed by a current," The American Physical Society, Physical Review B, vol. 54, No. 13, Oct. 1, 1996. (6 pages).
J.C. Slonczewski, "Current-driven excitation of magnetic multilayers," Journal of Magnetism and Magnetic Materials, vol. 159, Issue 1-2, p. L1-L7. (7 pages).
Mangin et al., "Current-inducedmagnetization reversal in nanopillars with perpendicular anisotropy," Nature Materials, vol. 5, Mar. 2006, pp. 210-215, Published online Feb. 19, 2006. (6 pages).

* cited by examiner

*Primary Examiner* — Viet Q Nguyen
(74) *Attorney, Agent, or Firm* — K&L Gates LLP

(57) ABSTRACT

A storage element includes a storage layer that stores information on the basis of a magnetization state of a magnetic material; a fixed magnetization layer that has a magnetization serving as a reference of the information stored in the storage layer; an interlayer that is formed of a nonmagnetic material and interposed between the storage layer and the fixed magnetization layer; a cap layer that is provided to be adjacent to the storage layer and opposite to the interlayer; and a metal cap layer that is provided to be adjacent to the cap layer and opposite to the storage layer.

4 Claims, 3 Drawing Sheets

STORAGE ELEMENT AND STORAGE DEVICE

CROSS REFERENCES TO RELATED APPLICATIONS

The present application claims priority to Japanese Priority Patent Application JP 2011-103683 filed in the Japan Patent Office on May 6, 2011, the entire content of which is hereby incorporated by reference.

BACKGROUND

The present disclosure relates to a storage element and a storage device incorporating the storage element. The storage element includes a storage layer which stores a magnetization state of a ferromagnetic layer as information and a fixed magnetization layer in which a magnetization direction is fixed, and changes the magnetization direction of the storage layer by the flow of an electric current.

Along with the dramatic progress of various kinds of information devices from mobile terminals to high-capacity servers, memory and logic elements configuring the information devices demand higher performance such as high integration, high speed, and low power consumption. In particular, the progress of semiconductor nonvolatile memories is remarkable and flash memories are becoming more widely used as high-capacity memory almost as if to eliminate hard disk drives from the market. Meanwhile, anticipating the progress in code storage memory or working memory, FeRAM (Ferroelectric Random Access Memory), MRAM (Magnetic Random Access Memory), PCRAM (Phase-Change Random Access Memory) and the like have been studied so as to replace NOR flash memory, DRAM and the like, which are currently used in general, therewith. Some of these memory types are already in practical use.

Among these, since MRAM records data on the basis of the magnetization direction of a magnetic material, rewriting can be performed rapidly and almost unlimitedly ($10^{15}$ times or more). Therefore, the MRAM is already used in the fields of industrial automation, airplanes, and the like. Although being expected to be developed as code storage memory or working memory in the future due to the high-speed operation and the reliability thereof, actually there are problems with MRAM in realizing low power consumption and high capacity. These problems are caused by the recording principal of the MRAM in which a current is respectively made to flow through two types of address interconnects (word line and bit line) almost intersecting with each other and magnetization of a magnetic layer of a magnetic storage element, which is located at the intersection of the address interconnects, is reversed by a current electric field generated from each of the address interconnects, thereby recording information. That is, this is a fundamental problem due to the method of reversing the magnetization by the electric current magnetic field generated from the interconnects.

As a solution to this problem, a recording not using the current magnetic field, that is, a method of reversing the magnetization without using a current magnetic field has been discussed. Among these, research relating to spin torque magnetization reversal has been vigorously carried out (for example, refer to Japanese Unexamined Patent Application Publication No. 2003-17782, U.S. Pat. No. 6,256,223, Japanese Unexamined Patent Application Publication No 2008-227388, PHYs. Rev. B, 54.9353 (1996), and J. Magn. Mat., 159, L1 (1996)).

Similar to MRAM, storage elements using spin torque magnetization reversal are in many cases configured with an MTJ (Magnetic Tunnel Junction). This configuration uses a phenomenon that, when spin polarized electrons which pass through a magnetic layer fixed in a given direction enter into another free magnetic layer (where the direction is not fixed), a torque is applied to the magnetic layer (this phenomenon is also referred to as a spin transfer torque). In this case, when a current equal to or greater than a given threshold value is made to flow, the free magnetic layer is reversed. 0 and 1 are rewritten by changing the polarity of the current.

The absolute value of the current for the reversal is equal to or less than 1 mA for an element in the scale of about 0.1 μm. In addition, since this current value reduces in proportion with the element volume, scaling is possible. Furthermore, since a word line which is necessary for generating the recording current magnetic field in the MRAM is not necessary, there is also an advantageous effect in that the cell structure is simple.

Hereinafter, the MRAM using spin torque magnetization reversal is referred to as ST-MRAM (Spin Torque-Magnetic Random Access Memory). Spin torque magnetization reversal may be sometimes referred to as spin injection magnetization reversal. ST-MRAM has attracted much attention as a nonvolatile memory which can realize low power consumption and high capacity while keeping the advantageous effect of MRAM of performing rewriting rapidly and almost unlimitedly.

SUMMARY

In the case of MRAM, write interconnects (word line and bit line) are provided separate from the storage element, and information can be written (recorded) by a current magnetic field generated when a current is made to flow through the write interconnects. Therefore, a sufficient amount of current necessary for writing can be made to flow through the write interconnects.

On the other hand, in ST-MRAM, the spin torque magnetization reversal is performed by the current made to flow in the storage element and it is necessary to reverse the magnetization direction of the storage layer. In this way, information can be written (recorded) by causing the current to flow directly into the storage element. Accordingly, in order to select a storage device which performs the writing, the storage element and a select transistor are connected to configure the storage device. In this case, the current made to flow in the storage element is limited to a magnitude of the current which can be made to flow in the select transistor (saturation current of the select transistor).

It is desirable to provide a storage element which can improve thermal stability without increasing the write current and has excellent coercive force, and a storage device incorporating the storage element.

According to an embodiment of the present disclosure, there is provided a storage element including: a storage layer that stores information on the basis of a magnetization state of a magnetic material; a fixed magnetization layer that has a magnetization serving as a reference of the information stored in the storage layer; an interlayer that is formed of a nonmagnetic material and interposed between the storage layer and the fixed magnetization layer; a cap layer that is provided to be adjacent to the storage layer and opposite to the interlayer; and a metal cap layer that is provided to be adjacent to the cap layer and opposite to the storage layer.

In this configuration, the magnetization of the storage layer is reversed using spin torque magnetization reversal which is caused by a current flowing in a lamination direction of a layer structure including the storage layer, the interlayer, and the fixed magnetization layer, thereby storing information, the interlayer and the cap layer are formed of an oxide, and the metal cap layer is formed of Pd or Pt.

According to another embodiment of the present disclosure, there is provided a storage device including: a storage element that stores information on the basis of a magnetization state of a magnetic material; and two types of interconnects intersecting with each other. The storage element includes a storage layer that stores information on the basis of a magnetization state of a magnetic material, a fixed magnetization layer that has a magnetization serving as a reference of the information stored in the storage layer, an interlayer that is formed of a nonmagnetic material and interposed between the storage layer and the fixed magnetization layer, a cap layer that is provided to be adjacent to the storage layer and opposite to the interlayer, and a metal cap layer that is provided to be adjacent to the cap layer and opposite to the storage layer, in which the magnetization of the storage layer is reversed using spin torque magnetization reversal which is caused by a current flowing in a lamination direction of a layer structure including the storage layer, the interlayer, and the fixed magnetization layer, thereby storing information, the interlayer and the cap layer are formed of an oxide, and the metal cap layer is formed of Pd or Pt. In addition, the storage element is disposed between the two types of interconnects, and the current in the lamination direction is made to flow in the storage element through the two types of interconnects, thereby causing the spin torque magnetization reversal.

According to the embodiment of the present disclosure, the storage element has a structure of providing the cap layer and the metal cap layer to be opposite to the interlayer with respect to the storage layer. However, since the metal cap layer is formed of Pd or Pt, the coercive force can increase.

According to the embodiments of the present disclosure, since the storage element having a perpendicular magnetic anisotropy can be easily obtained, the storage element which sufficiently secures thermal stability as information storage capability and has well-balanced characteristics can be configured. Accordingly, the operating margin of the storage element can be sufficiently obtained without operation errors.

Therefore, a memory which stably operates with high reliability can be realized.

In addition, a write current can be reduced and thus power consumption can be reduced when writing is performed on the storage element.

Therefore, the power consumption of the entire storage device can be reduced.

Additional features and advantages are described herein, and will be apparent from the following Detailed Description and the figures.

DETAILED DESCRIPTION

Hereinafter, an embodiment according to the present disclosure will be described in the following order.
1. Configuration of Storage Device according to Embodiment
2. Overview of Storage Element according to Embodiment
3. Specific Configuration of Embodiment
4. Experiment Relating to Embodiment
1. Configuration of Storage Device According to Embodiment First, the configuration of a storage device according to the embodiment of the present disclosure will be described.

Figure 1:
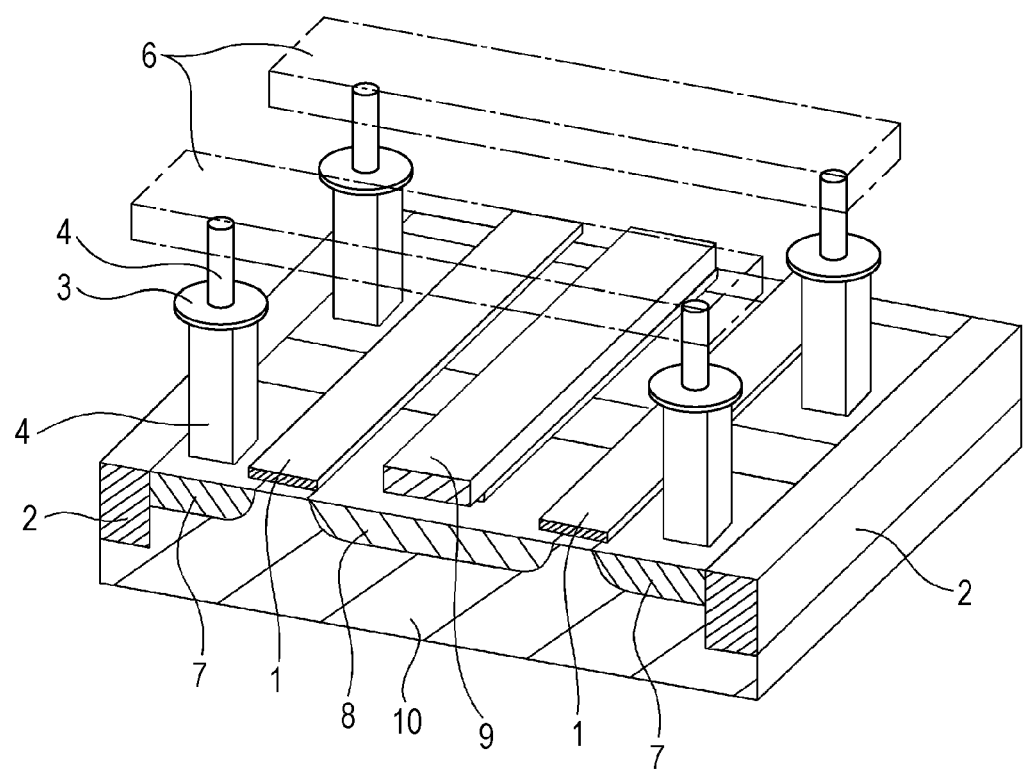
FIG. 1 is a perspective view schematically showing a configuration of a storage device according to an embodiment of the present disclosure.
Figure 2:
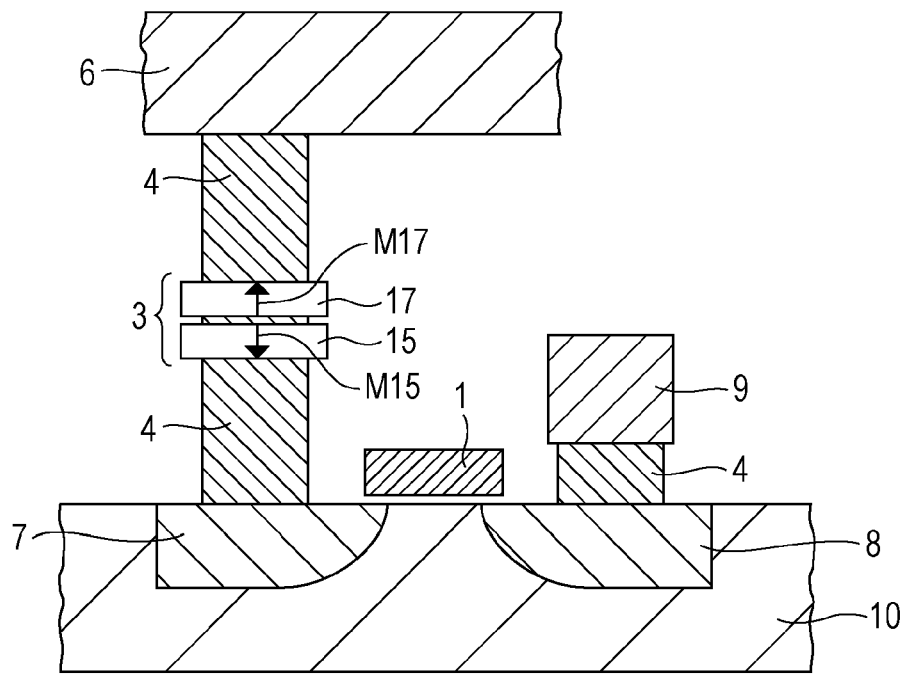
FIG. 2 is a cross-sectional view showing a storage device according to an embodiment of the present disclosure.

FIGS. 1 and 2 schematically show the storage device according to the embodiment. FIG. 1 is a perspective view and FIG. 2 is a cross-sectional view.

As shown in FIG. 1, in the storage device according to the embodiment, a storage element 3 which is configured by ST-RAM and can store information on the basis of a magnetization state is disposed in the vicinity of the intersection of two types of address interconnects (for example, a word line and a bit line) intersecting with each other.

That is, a drain region 8, a source region 7, and a gate electrode 1 which configure a select transistor for selecting each storage device are respectively formed in a portion, which is isolated by an element isolation layer 2, of a semiconductor substrate 10 such as a silicon substrate. Among these, the gate electrode 1 overlaps one of the address interconnects (word line) which extends in the front-back direction of the drawing.

The drain region 8 is formed to be shared by the select transistors in the left and right sections of FIG. 1. An interconnect 9 is connected to the drain region 8.

In addition, the storage element 3 including a storage layer where a magnetization direction is reversed by spin torque magnetization reversal is disposed between the source region 7 and the bit line 6 which is disposed above and extends in the left-right direction of FIG. 1. The storage element 3 includes a magnetic tunnel junction (MTJ) element, for example.

As shown in FIG. 2, the storage element 3 includes two magnetic layers 15 and 17. One of the two magnetic layers 15 and 17 is set as a fixed magnetization layer 15 where a direction of a magnetization M15 is fixed and the other magnetic layer is set as a free magnetic layer where a direction of a magnetization M17 changes, that is, a storage layer 17. In addition, the storage element 3 is connected to the bit line 6 and the source region 7 through upper and lower contact layers 4.

Accordingly, a current is made to flow in the storage element 3 in the vertical direction through the two types of address interconnects 1 and 6 and the direction of the magnetization M17 of the storage layer 17 can be reversed by the spin torque magnetization reversal.

In such a storage device, it is necessary to perform writing with a current equal to or less than a saturation current of the select transistor, and the saturation current of the transistor is reduced along with miniaturization of the storage device. Therefore, for miniaturization, it is necessary to improve the efficiency of the spin transfer and reduce the current made to flow in the storage element 3.

In addition, in order to amplify a read signal, it is necessary to secure a large magnetoresistance change rate. To that end, it is effective to employ the above-described MTJ structure, that is, to configure the storage element 3 where a tunnel insulation layer (tunnel barrier layer) as the interlayer is interposed between the two layers of magnetic layers 15 and 17.

In this way, when the tunnel insulation layer is used as the interlayer, the amount of a current made to flow in the storage element 3 is limited in order to prevent the tunnel insulation layer from being broken down. That is, the current necessary for the spin torque magnetization reversal should be limited from the viewpoint of securing the reliability for repetitive writing of the storage element 3.

The current necessary for the spin torque magnetization reversal may sometimes be referred to as a reversal current, a record current, or the like.

Meanwhile, since the storage device is a nonvolatile memory, it is necessary to stably store information written by the current. That is, it is necessary to secure the stability (thermal stability) for thermal fluctuation of the magnetization of the storage layer.

When the thermal stability of the storage layer is not secured, the reversed direction of the magnetization may be reversed again by heat (temperature under the operation environment), thereby generating write error.

As compared to a MRAM in the related art, the storage element 3 in the storage device according to the embodiment has an advantageous effect in scaling. That is, the volume can be reduced. However, the reduction in volume may lead to the deterioration of the thermal stability if the other characteristics are the same.

When the capacity of the ST-MRAM is increased, the volume of the storage element 3 is further reduced. Therefore, securing the thermal stability is an important issue.

Therefore, the thermal stability is a significantly important characteristic for the storage element 3 in the ST-MRAM, and it is necessary to design the storage element which can secure the thermal stability even when the volume is reduced.

2. Overview of Storage Element According to Embodiment

Next, the overview of the storage element according to the embodiment of the present disclosure will be described.

According to the embodiment of the present disclosure, the direction of the magnetization of the storage layer of the storage element is reversed by the above-described spin torque magnetization reversal, thereby recording information.

The storage layer is formed of a magnetic material containing a ferromagnetic layer and stores information on the basis of the magnetization state of the magnetic material (direction of the magnetization).

Figure 3:
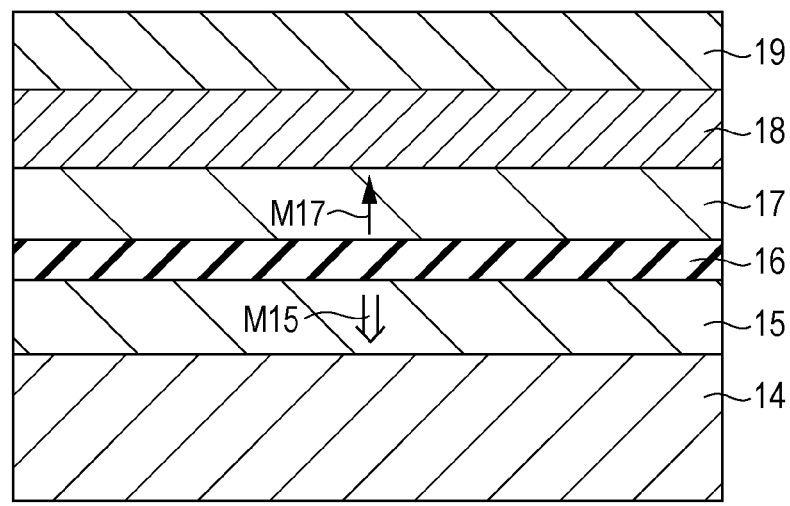
FIG. 3 is a cross-sectional view showing a layer structure of a storage element according to an embodiment of the present disclosure.

For example, the storage element 3 has a layer structure as shown in FIG. 3, and includes at least two ferromagnetic layers of the storage layer 17 and the fixed magnetization layer 15 and the interlayer 16 interposed between the two magnetic layers.

The storage layer 17 has the magnetization perpendicular to the layer surface, and the direction of the magnetization is changed in response to information.

The fixed magnetization layer 15 has the magnetization which is perpendicular to the layer surface and serves as a reference of the information written in the storage layer 17.

The interlayer 16 is formed of a nonmagnetic material and disposed between the storage layer 17 and the fixed magnetization layer 15.

In addition, by injecting electrons which are spin-polarized in a lamination direction of the layer structure including the storage layer 17, the interlayer 16, and the fixed magnetization layer 15, the direction of the magnetization of the storage layer 17 is changed and information is recorded on the storage layer 17.

Here, spin torque magnetization reversal will be described in brief.

Electrons have two types of spin angular momentums.

For convenience, these may be defined as upward and downward momentums. The numbers of both are the same in nonmagnetic materials but different in ferromagnetic materials. In the fixed magnetization layer 15 and the storage layer 17 as the two layers of ferromagnetic materials configuring the storage element 3, it is assumed that the electrons are moved from the fixed magnetization layer 15 to the storage layer 17 in a state the directions of the magnetic moments are opposite.

The fixed magnetization layer 15 is a fixed magnetic layer where the direction of the magnetic moment is fixed for high coercive force.

The electrons which have passed through the fixed magnetization layer 15 are spin-polarized. That is, a difference is generated between the numbers of the upward and downward electrons. When the thickness of the interlayer 16 as the nonmagnetic layer is sufficiently thin, the spin polarization can be alleviated by the electrons passing through the fixed magnetization layer 15. The electrons reach the other magnetic material, that is, the storage layer 17, before an unpolarized state (the numbers of the upward and downward electrons are the same) in the normal nonmagnetic material.

In the storage layer 17, the sign of the spin polarization is reversed. Therefore, in order to reduce the energy of the system, a number of electrons are reversed, that is, the direction of the spin angular momentum is changed. At this time, since the total angular momentum of the system should be conserved, the reaction, which is equivalent to the sum total of angular momentum changes of the direction-changed electrons, is applied to the magnetic moment of the storage layer 17.

When the current is low, that is, when the number of electrons passed within a unit time is small, the total number of the direction-changed electrons is also small. Therefore, the angular momentum changes generated by the magnetic moment of the storage layer 17 are also small. However, when the current is high, most of the angular moment changes can be applied within the unit time.

The temporal change of the angular momentum is torque. When the torque exceeds a given threshold, the magnetic moment of the storage layer 17 starts precession and rotates by 180° due to the uniaxial anisotropy thereof to become stable. That is, the magnetic moment is reversed from the opposite direction state to the same direction state.

When the magnetization is in the same direction state, the current is made to flow in a direction moving the electrons from the storage layer 17 to the fixed magnetization layer 15. In this case, when the electrons, which are spin-reversed when being reflected in the fixed magnetization layer 15, enter into the storage layer 17, a torque is applied thereto. As a result, the magnetic moment can be reversed to the opposite direction. At this time, the amount of current necessary for the reversal is larger than the case of being reversed from the opposite direction state to the same direction state.

It is difficult to instinctively understand the reversal of the magnetic moment from the same direction to the opposite direction. However, it may be understood as follows: the magnetic moment is difficult to be reversed because the fixed magnetization layer 15 is fixed; and the storage layer 17 is reversed in order to conserve the total angular momentum of the system. In this way, 0 and 1 are recorded by causing to flow the current, which is equal to or more than the given threshold and corresponds to the respective polarities, in the direction from the fixed magnetization layer 15 to the storage layer 17 or in the opposite direction thereof.

Similar to a case in a MRAM in the related art, information is read using the magnetoresistance effect.

That is, similar to the case of the recording described above, a current is made to flow in the direction perpendicular to the layer surface. In addition, the reading is performed using a phenomenon that an impedance indicated by the element changes depending on whether the magnetic moment of the storage layer 17 has the same direction as or the opposite direction to the that of the fixed magnetization layer 15.

A material used as the interlayer 16 interposed between the fixed magnetization layer 15 and the storage layer 17 may be a metal or an insulating material. However, the insulating material as the interlayer can obtain a higher read signal (resistance change rate) and perform recording at a lower current. The element at this time is referred to as a Magnetic Tunnel Junction (MTJ).

A threshold Ic of a current, which is necessary when the direction of the magnetization of the magnetic layer is reversed by the spin torque magnetization reversal, varies depending whether a magnetization easy axis of the magnetic layer is in the in-plane direction or the perpendicular direction.

The storage element according to the embodiment is a perpendicular magnetization type. In the case of an in-plane magnetization type storage element in the related art, when the reversal current where the direction of the magnetization of the magnetic layer is reversed is represented by Ic_para and the magnetization is reversed from the same direction to the opposite direction (here, the same direction and the opposite direction represent the magnetization direction of the storage layer with reference to the magnetization direction of the fixed magnetization layer), the following expression is satisfied.

$$Ic\_para = (A \cdot \alpha \cdot Ms \cdot V/g(0)/P)(Hk+2\pi Ms)$$

When the magnetization is reversed from the opposite direction to the same direction, the following expression is satisfied.

$$Ic\_para = -(A \cdot \alpha \cdot Ms \cdot V/g(\pi)/P)(Hk+2\pi Ms)$$

(Hereinafter, the above expressions will be referred to as Expressions (1).)

On the other hand, when the reversal current of the perpendicular magnetization type storage layer according to the embodiment is represented by Ic_perp and the magnetization is reversed from the same direction to the opposite direction, the following expression is satisfied.

$$Ic\_perp = (A \cdot \alpha \cdot Ms \cdot V/g(0)/P)(Hk-4\pi Ms)$$

When the magnetization is reversed from the opposite direction to the same direction, the following expression is satisfied.

$$Ic\_perp = -(A \cdot \alpha \cdot Ms \cdot V/g(\pi)/P)(Hk-4\pi Ms)$$

(Hereinafter, the above expressions will be referred to as Expressions (2).)

In these expressions, A represents a constant, α represents a damping constant, Ms represents a saturation magnetization, V represents an element volume, P represents a spin polarizability, g(0) and g(π) respectively represent coefficients corresponding to efficiencies of transmitting the spin torques to the counter magnetic layer in the same direction and in the opposite direction, and Hk represents a magnetic anisotropy (refer to Nature Materials., 5, 210 (2006)).

In each of the above-described expressions, when (Hk−4πMs) in the case of the perpendicular magnetization type and (Hk+2πMs) in the case of the in-plane magnetization type are compared, it can be understood that the perpendicular magnetization type is more fitted for reducing the record current.

According to the embodiment, the storage layer 3 includes the magnetic layer (storage layer 17) which can store information on the basis of the magnetization state and the fixed magnetization layer 15 where the direction of the magnetization is fixed.

In order to act as a memory, it is necessary to store written information. The capability of storing information is determined by a value of an index $\Delta$ (=$KV/k_B T$) of the thermal stability. The index $\Delta$ is expressed by the following Expression (3).

$$\Delta = K \cdot V/k_B \cdot T = Ms \cdot V \cdot Hk(\frac{1}{2}k_B \cdot T) \qquad \text{Expression (3)}$$

In this expression, Hk: effective anisotropy field, $k_B$: Boltzmann constant, T: temperature, Ms: saturation magnetization amount, V: volume of storage layer 17, and K: anisotropy energy.

The effective anisotropy field Hk includes shape magnetic anisotropy, induced magnetic anisotropy, and crystal magnetic anisotropy. When a single-domain coherent rotation mode is assumed, the effective anisotropy field is equal to the coercive force.

The index $\Delta$ of the thermal stability has a trade-off relationship with the threshold Ic of current in many cases. Therefore, in order to maintain memory characteristics, the trade-off therebetween becomes an issue in many cases.

When the thickness of the storage layer 17 is 2 nm and a TMR element with a plane pattern of 100 nm×150 nm has a substantially elliptical shape, for example, the thresholds of the current which change the magnetization state of the storage layer 17 are actually as follows.

Threshold On+Side+$Ic$=+0.5 mA

Threshold On−Side−$Ic$=−0.3 mA

The current density at this time is about $3.5 \times 10^6$ A/cm². These are almost equal to the above-described Expressions (1).

On the other hand, in a normal MRAM where the magnetization is reversed by the current magnetic field, a write current of several tens of mA or more is necessary.

Therefore, it can be seen that the ST-MRAM is effective for reducing the power consumption of an integrated circuit because the threshold of the write current is sufficiently low as described above.

In addition, since an interconnect for generating the current magnetic field which is necessary for the normal MRAM is unnecessary, the ST-MRAM is effective even in terms of integration, as compared to the normal MRAM.

In addition, when the spin torque magnetization reversal is performed, a direct current is made to flow in the storage element 3 to write (record) information. Accordingly, in order to select the storage element 3 which performs the writing, the storage device is configured to connect the storage element 3 to the select transistor.

In this case, the current made to flow in the storage element 3 is limited to a magnitude of the current which can be made to flow in the select transistor (saturation current of the select transistor).

In order to reduce the record current, it is desirable to employ the perpendicular magnetization type as described above. In addition, since a perpendicular magnetic layer can secure a higher magnetic anisotropy than that of an in-plane magnetic layer in general, the perpendicular magnetic layer is preferable from the viewpoint of securing a large value of the above-described index A of the thermal stability.

Various kinds of magnetic material having perpendicular anisotropy are used, such as a rare earth-transition metal alloy (for example, TbCoFe), a metal multilayer (for example, Co/Pd multilayer), an ordered alloy (for example, FePt), or a material using the interface anisotropy between an oxide and a magnetic metal (for example, Co/MgO). However, the rare earth-transition metal alloy loses the perpendicular magnetic anisotropy when being diffused and crystallized by heating, which is not preferable as the material of ST-MRAM. Similarly, in the case of the metal multilayer, the perpendicular magnetic anisotropy deteriorates when being diffused by heating and the perpendicular magnetic anisotropy is developed in a (111) oriented face-centered cubic lattice. Therefore, it is difficult to realize the (001) orientation necessary for a high polarizability layer such as MgO; or Fe, CoFe, and CoFeB disposed adjacent to MgO. Since an L10 ordered alloy is stable even at a high temperature and the perpendicular magnetic anisotropy is developed in the (001) orientation, the above-described problem does not occur. However, it is necessary to perform ordering of atoms by performing heating at 500° C. or more during manufacture or by performing heat treatment at a high temperature of 500° C. or more after manufacture. Therefore, there is a possibility that an unfavorable diffusion or an increase in interface roughness may be caused in the other portion of laminated layers such as a tunnel barrier.

On the other hand, a layer where a Co-based or Fe-based material is laminated on a material using the interface magnetic anisotropy, that is, on MgO as the tunnel barrier, is not likely to have the above-described problems and thus highly expected as the material of the storage layer for the ST-MRAM.

The perpendicular magnetic anisotropy oriented from the interface magnetic anisotropy is caused by bonding oxygen contained in the oxide to Co or Fe in the interface. However, there are problems in that the anisotropic energy is low and deteriorates as the thickness of the magnetic layer becomes thicker, as compared to the crystal magnetic anisotropy developed by the ordered alloy and single-ion anisotropy developed by the rare earth.

As a solution to these problems, the embodiment of the present disclosure suggests a structure of disposing oxides at both sides of the magnetic metal to increase the number of interfaces. That is, the method is suggested in which the anisotropy of the storage layer is increased by employing a structure where a substrate, a ground layer, a fixed magnetization layer, an MgO (interlayer), a storage layer, a cap layer formed of oxides, and a metal cap layer are laminated in this order.

According to the embodiment, the storage layer 17 is the perpendicular magnetic layer containing at least one of Co and Fe.

Furthermore, when considering the saturation current value of the select transistor, the magnetic tunnel junction (MTJ) element is configured using the tunnel insulation layer 16 formed of the insulating material as the nonmagnetic interlayer 16 interposed between the storage layer 17 and the fixed magnetization layer 15.

When the magnetic tunnel junction (MTJ) element is configured using the tunnel insulation layer, the magnetoresistance change rate (MR ratio) can be increased and the intensity of the read signal can be increased, as compared to a case of configured a giant magnetoresistance (GMR) element using a nonmagnetic conductive layer.

In particular, the magnetoresistance change rate (MR ratio) can be increased by using magnesium oxide (MgO) as the material of the interlayer 16 as the tunnel insulation layer.

In addition, generally, the efficiency of the spin transfer depends on the MR ratio. The larger MR ratio can improve the efficiency of the spin transfer and reduce the current density of the magnetization reversal.

Therefore, by using magnesium oxide as the material of the tunnel insulation layer and using the above-described storage layer 17 at the same time, the current threshold when writing is performed using the spin torque magnetization reversal can be reduced and information can be written (recorded) at a low current. In addition, the intensity of the read signal can be increased.

As a result, the MR ratio (TMR ratio) can be secured, the current threshold when writing is performed using the spin torque magnetization reversal can be reduced, and information can be written (recorded) at a low current. In addition, the intensity of the read signal can be increased.

When the tunnel insulation layer is the magnesium oxide (MgO) layer, it is preferable that the MgO layer be crystallized and the crystal orientation be maintained in the 001 orientation.

In addition, according to the embodiment, the interlayer 16 (tunnel insulation layer) between the storage layer 17 and the fixed magnetization layer 15 may be configured by various kinds of insulating materials, dielectric materials, and semiconductor materials in addition to magnesium oxide, for example, aluminum oxide, aluminum nitride, $SiO_2$, $Bi_2O_3$, $MgF_2$, CaF, $SrTiO_2$, $AlLaO_3$, and Al—N—O.

It is necessary that the area resistance value of the tunnel insulation layer be controlled to be equal to less than several $\Omega\mu m^2$, from the viewpoint of obtaining the current density necessary for reversing the direction of the magnetization of the storage layer 17 using the spin torque magnetization reversal.

In addition, in order to control the area resistance value in the above-described range, it is necessary that the thickness of the tunnel insulation layer formed of MgO be set to be equal to or less than 1.5 nm.

In addition, according to the embodiment of the present disclosure, a cap layer 18 is disposed to be adjacent to the storage layer 17, and the cap layer 18 is formed of an oxide.

Examples of the cap layer 18 formed of the oxide include MgO, aluminum oxide, $TiO_2$, $SiO_2$, $Bi_2O_3$, $SrTiO_2$, $AlLaO_3$, and Al—N—O.

Furthermore, according to the embodiment of the present disclosure, a metal cap layer 19 is disposed to be adjacent to the cap layer 18 and opposite to the storage layer 17.

The metal cap layer 19 is formed of Pd or Pt.

In addition, in order for the direction of the magnetization of the storage layer 17 to be easily reversed at a low current, it is preferable to reduce the storage element 3 in size.

Therefore, preferably, the area of the storage element 3 is equal to or less than 0.01 $\mu m^2$.

In addition, elements other than Co and Fe can be added to the storage layer 17 according to the embodiment of the present disclosure.

By the addition of different kinds of elements, the effects of improving heat-resistance and increasing the magnetoresistance effect due to the prevention of diffusion and the effects of increasing dielectric strength voltage due to flattening and the like can be obtained. Examples of the elements added in this case include B, C, N, O, F, Mg, Si, P, Ti, V, Cr, Mn, Ni, Cu, Ge, Nb, Mo, Ru, Rh, Pd, Ag, Ta, W, Ir, Pt, Au, Zr, Hf, Re, and Os; and alloys thereof.

In addition, in the storage layer 17 according to the embodiment of the present disclosure, other ferromagnetic layers having different compositions can be directly laminated. In addition, a ferromagnetic layer and a soft magnetic layer can be laminated or plural ferromagnetic layers can be laminated with a soft magnetic layer and a nonmagnetic layer interposed therebetween. In such a lamination structure, the effect according to the embodiment of the present disclosure can be obtained.

In particular, in a structure where the plural ferromagnetic layers are laminated with the nonmagnetic layer interposed therebetween, the intensity of the interaction between the ferromagnetic layers can be adjusted. Therefore, even when the size of the storage layer 3 is equal to or less than a submicron, the magnetic reversal current can be suppressed from increasing. In this case, examples of materials of the nonmagnetic layer include Ru, Os, Re, Ir, Au, Ag, Cu, Al, Bi, Si, B, C, Cr, Ta, Pd, Pt, Zr, Hf, W, Mo, and Nb; and alloys thereof.

It is preferable that the thickness of the fixed magnetization layer 15 and the storage layer 17 be respectively 0.5 nm to 30 nm.

The other configurations of the storage element 3 can be the same as existing configurations of the storage element 3 in the related art which records information using the spin torque magnetization reversal.

The fixed magnetization layer 15 can have a configuration in which the direction of the magnetization is fixed by only the ferromagnetic layer or by the antiferromagnetic bonding between an antiferromagnetic layer and the ferromagnetic layer.

In addition, the fixed magnetization layer 15 can have a structure in which a single-layer ferromagnetic layer is formed or a ferromagnetic pinned structure in which the plural ferromagnetic layers are laminated with the nonmagnetic layer interposed therebetween.

Examples of materials of the ferromagnetic layer configuring the fixed magnetization layer 15 having the ferromagnetic pinned structure include Co, CoFe, and CoFeB. In addition, examples of materials of the nonmagnetic layer include Ru, Re, Ir, and Os.

Examples of materials of the antiferromagnetic layer include magnetic materials such as FeMn alloys, PtMn alloys, PtCrMn alloys, NiMn alloys, IrMn alloys, NiO, and $Fe_2O_3$.

In addition, by adding nonmagnetic elements such as Ag, Cu, Au, Al, Si, Bi, Ta, B, C, O, N, Pd, Pt, Zr, Hf, Ir, W, Mo, and Nb to these magnetic materials, the magnetic characteristics can be adjusted and various physical properties such as a crystal structure, a crystallinity, and a substance stability can be adjusted.

In addition, the layer structure of the storage element 3 does not have a problem when the storage layer 17 is disposed below the fixed magnetization layer 15. In this case, the function of the above-described conductive oxide cap layer can be performed by the conductive oxide ground layer.

3. Specific Configuration of Embodiment

Next, the specific configuration of the embodiment according to the present disclosure will be described.

In the configuration of the storage device, as described above with reference to FIG. 1, the storage element 3 which can store information on the basis of the magnetization state is disposed in the vicinity of the intersection of the two types of address interconnects 1 and 6 (for example, word line and bit line) intersecting with each other.

In addition, a current is made to flow in the storage element 3 in the vertical direction through the two types of address interconnects 1 and 6 and thus the direction of the magnetization of the storage layer 17 can be reversed by the spin torque magnetization reversal.

FIG. 3 shows the specific structure of the storage element 3.

As shown in FIG. 3, in the storage element 3, the fixed magnetization layer 15 is disposed below the storage layer 17 where the direction of the magnetization M17 is reversed by the spin torque magnetization reversal.

In the ST-MRAM, 0 and 1 of the information are defined by a relative angle between the magnetization M17 of the storage layer 17 and the magnetization M15 of the fixed magnetization layer 15.

The interlayer 16 as the tunnel barrier layer (tunnel insulation layer) is provided between the storage layer 17 and the fixed magnetization layer 15. The MTJ element is configured by the storage layer 17 and the fixed magnetization layer 15.

In addition, the ground layer 14 is formed below the fixed magnetization layer 15.

The cap layer 18 is formed above the storage layer 17 (that is, adjacent to the storage layer 17 and opposite to the interlayer 16).

Furthermore, the metal cap layer 19 is formed above the cap layer 18 (that is, adjacent to the cap layer 18 and opposite to the storage layer 17).

In the embodiment, the storage layer 17 is the perpendicular magnetic layer containing at least one of Co and Fe.

In addition, the cap layer 18 is formed of the conductive oxide.

The metal cap layer 19 is formed of Pd or Pt.

Furthermore, in the embodiment, when the interlayer 16 is the magnesium oxide layer, the magnetoresistance change rate (MR ratio) can be increased.

By increasing the MR ratio in this way, the efficiency of spin injection can be increased and the current density necessary for reversing the direction of the magnetization M17 of the storage layer 17 can be reduced.

In the storage element 3 according to the embodiment, the layers from the ground layer 14 to the metal cap layer 19 are continuously formed in vacuum equipment. Thereafter, a pattern of the storage element 3 is formed by a process such as etching. As a result, the storage element can be manufactured.

According to the above-described embodiment, since the storage layer 17 of the storage element 3 is the perpendicular magnetic layer, the amount of write current necessary for reversing the direction of the magnetization M17 of the storage layer 17 can be reduced.

In this way, since the thermal stability as the information storage capability can be sufficiently secured, the storage element 3 has well-balanced characteristics.

Accordingly, the operating margin of the storage element 3 can be sufficiently obtained without operation errors. As a result, the storage element 3 can be operated stably.

That is, a storage device which can operate stably with high reliability can be realized.

In addition, the write current can be reduced and thus the power consumption can be reduced when writing is performed on the storage element 3.

As a result, the storage device having the storage element 3 according to the embodiment can reduce the power consumption.

As described above, memory which has excellent information storage capability and can stably operate with high reliability can be realized, and memory having the storage element 3 can reduce the power consumption.

In addition, the storage device which has the storage element 3 shown in FIG. 3 and the structure shown in FIG. 1 has an advantageous effect in that a general semiconductor MOS forming process can be applied when being manufactured.

Therefore, the memory according to the embodiment can be used as a general-purpose memory.

4. Experiment Relating to Embodiment

Here, in the configuration of the storage element 3 according to the embodiment, samples of the storage element 3 were prepared by selecting specific materials forming the metal cap layer 19, and the characteristics thereof were examined Actually, the storage device has a semiconductor switching circuit and the like in addition to the storage element 3 as shown in FIG. 1. However, in this experiment, in order to examine the magnetization reversal characteristics of the storage layer 17 adjacent to the cap layer 18, the examination was carried out using a wafer in which only the storage element 3 is formed.

A 300 nm-thick thermally oxidized layer was formed above a 0.725 mm-thick silicone substrate and the storage element 3 having a structure shown in FIG. 3 was formed thereon.

Specifically, in the storage element 3 having the structure shown in FIG. 3, materials and thickness of the respective layers were selected as follows.

Figure 4:
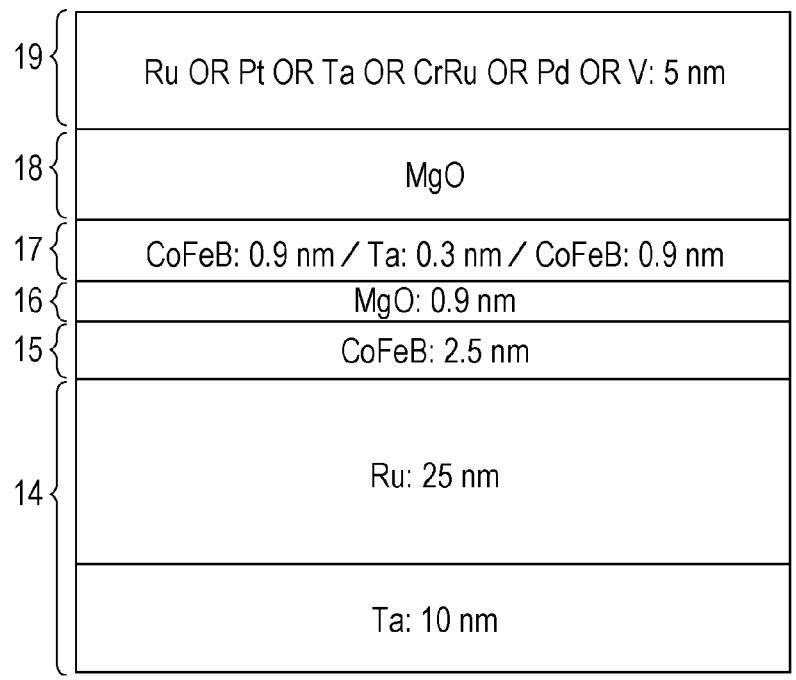
FIG. 4 is a diagram showing a layer structure of a storage element used in experiments.

As shown in FIG. 4, the materials and thickness were selected as follows.

Ground layer 14: a layer where a 10 nm-thick Ta layer and a 25 nm-thick Ru layer are laminated.

Fixed magnetization layer 15: a 2.5 nm-thick CoFeB layer

Interlayer (tunnel insulation layer) 16: a 0.9 nm-thick magnesium oxide layer Storage layer 17: a layer where CoFeb, Ta, and CoFeB are laminated Cap layer 18: a MgO layer Metal cap layer 19: a 5 nm-thick layer formed of one of Ru, Pt, Ta, CrRu, Pd, and V That is, as the 5 nm-thick metal cap layer 19, six kinds of samples were prepared using six kinds of materials.

In the above-described layer configuration, the ferromagnetic layer of the storage layer 17 had a 0.9 nm-thick CoFeB, a 0.3 nm-thick Ta, and a 0.9 nm-thick CoFeB. The composition of CoFeB was Co 16%-Fe 64%-B 20%.

The interlayer 16 formed of the magnesium oxide (MgO) and the cap layer 18 was formed by RF magnetron sputtering. The other layers are formed by DC magnetron sputtering.

Furthermore, after forming the respective layers of the storage layer 3, heat treatment was performed in a magnetic field heat treatment furnace at 300° C. for two hours.

Figure 5:
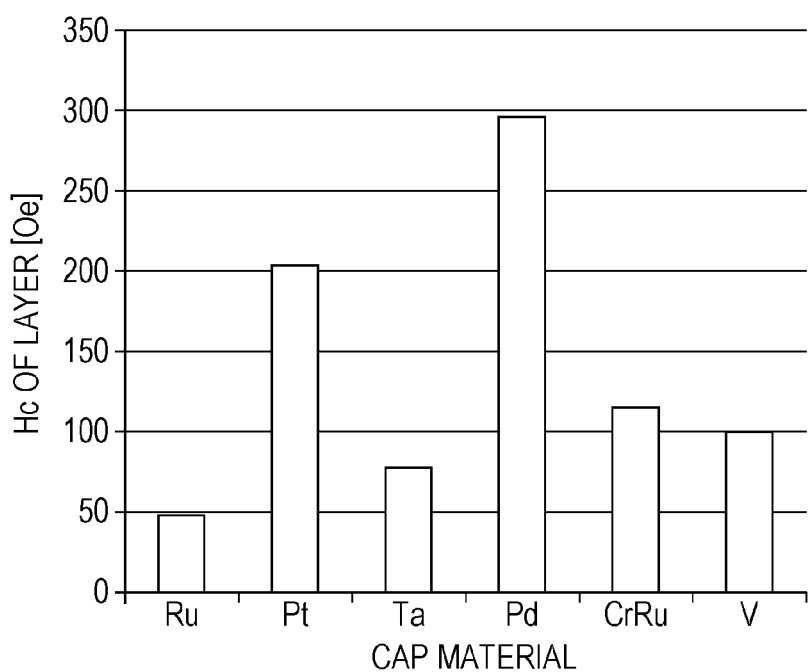
FIG. 5 is a diagram showing the relationship between composition materials of a metal cap layer and coercive force.

The magnetic characteristics of the above-described samples were evaluated using the magneto-optical Kerr effect. The relationship between the coercive force thus obtained and the material of the metal cap layer is shown in FIG. 5.

These layers are the perpendicular magnetic layer. However, there were significant differences in the coercive force, and it can be seen that Pd and Pt exhibited a high coercive force.

That is, an ordered element using Pd or Pt as the metal cap layer 19 as in the embodiment can improve the coercive force.

In addition, according to the embodiment, since the storage element having the perpendicular magnetic anisotropy can be simply obtained, the thermal stability as the information storage capability can be secured and the storage element having well-balanced characteristics can be configured. Accordingly, the operating margin of the storage element can be sufficiently obtained without operation errors. Therefore, memory which stably operates with high reliability can be realized.

In addition, the write current can be reduced and thus the power consumption can be reduced when writing is performed on the storage element. Therefore, the power consumption of the entire storage device can be reduced.

Hereinabove, the embodiment has been described. However, the present disclosure is not limited to the layer configuration of the storage layer 3 according to the above-described embodiment, and various layer configurations can be employed.

For example, in the embodiment, the fixed magnetization layer 15 is formed of CoFeB, but the present disclosure is not limited thereto. Other various configurations can be applied without departing the concept of the present disclosure.

In addition, in the embodiment, the ground layer, the cap materials, and the form of the storage layer has only one configuration, respectively, but the present disclosure is not limited thereto. Other various configurations can be applied without departing the concept of the present disclosure.

In addition, in the embodiment, the fixed magnetization layer 15 has a single layer. However, the ferromagnetic pinned structure in which two layers of the ferromagnetic layer and the nonmagnetic layer are laminated may be employed. Furthermore, a structure in which the antiferromagnetic layer is applied to a layer having the ferromagnetic pinned structure may be employed.

In addition, the layer configuration of the storage element 3 has no problem in either case where the storage layer 17 is disposed above or below the fixed magnetization layer 16.

An embodiment according to the present disclosure can have the following configurations.

(1) A storage element including:

a storage layer that stores information on the basis of a magnetization state of a magnetic material;

a fixed magnetization layer that has a magnetization serving as a reference of the information stored in the storage layer;

an interlayer that is formed of a nonmagnetic material and interposed between the storage layer and the fixed magnetization layer;

a cap layer that is provided to be adjacent to the storage layer and opposite to the interlayer; and a metal cap layer that is provided to be adjacent to the cap layer and opposite to the storage layer, wherein the magnetization of the storage layer is reversed using a spin torque magnetization reversal which is caused by a current flowing in a lamination direction of a layer structure including the storage layer, the interlayer, and the fixed magnetization layer, thereby storing information, the interlayer and the cap layer are formed of an oxide, and the metal cap layer is formed of Pd or Pt.

(2) The storage element according to (1) described above, wherein the storage layer includes an alloy region containing at least one of Fe and Co.

(3) The storage element according to (1) or (2) described above, wherein the storage layer and the fixed magnetization layer have a magnetization perpendicular to the layer surfaces.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
a storage layer that stores information on the basis of a magnetization state of a magnetic material;
a fixed magnetization layer that has a magnetization serving as a reference of the information stored in the storage layer;
an interlayer that is formed of a nonmagnetic material and interposed between the storage layer and the fixed magnetization layer;
a cap layer that is provided to be adjacent to the storage layer and opposite to the interlayer; and
a metal cap layer that is provided to be adjacent to the cap layer and opposite to the storage layer,
wherein the magnetization of the storage layer is reversed using spin torque magnetization reversal which is caused by a current flowing in a lamination direction of a layer structure including the storage layer, the interlayer, and the fixed magnetization layer, thereby storing information,
the interlayer and the cap layer are formed of an oxide, and
the metal cap layer is formed of Pd or Pt.

2. The storage element according to claim 1,
wherein the storage layer includes an alloy region containing at least one of Fe and Co.

3. The storage element according to claim 2,
wherein the storage layer and the fixed magnetization layer have a magnetization perpendicular to the layer surfaces.

4. A storage device comprising:
a storage element that stores information on the basis of a magnetization state of a magnetic material; and
two types of interconnects intersecting with each other,
wherein the storage element includes a storage layer that stores information on the basis of a magnetization state of a magnetic material, a fixed magnetization layer that has a magnetization serving as a reference of the information stored in the storage layer, an interlayer that is formed of a nonmagnetic material and interposed between the storage layer and the fixed magnetization layer, a cap layer that is provided to be adjacent to the storage layer and opposite to the interlayer, and a metal cap layer that is provided to be adjacent to the cap layer and opposite to the storage layer, in which the magnetization of the storage layer is reversed using spin torque magnetization reversal which is caused by a current flowing in a lamination direction of a layer structure including the storage layer, the interlayer, and the fixed magnetization layer, thereby storing information, the interlayer and the cap layer are formed of an oxide, and the metal cap layer is formed of Pd or Pt,
the storage element is disposed between the two types of interconnects, and
the current in the lamination direction is made to flow in the storage element through the two types of interconnects, thereby causing the spin torque magnetization reversal.

* * * * *